(12) United States Patent
Hill

(10) Patent No.: US 8,576,021 B2
(45) Date of Patent: Nov. 5, 2013

(54) TUNED RESONANT CIRCUITS

(75) Inventor: Nicholas Patrick Roland Hill, Cambridge (GB)

(73) Assignee: Cambridge Resonant Technologies Ltd., Cambridge (GB)

( * ) Notice: Subject to any disclaimer, the term of this patent is extended or adjusted under 35 U.S.C. 154(b) by 76 days.

(21) Appl. No.: 13/129,101

(22) PCT Filed: Oct. 20, 2009

(86) PCT No.: PCT/GB2009/051406
§ 371 (c)(1),
(2), (4) Date: Jun. 16, 2011

(87) PCT Pub. No.: WO2010/055321
PCT Pub. Date: May 20, 2010

(65) Prior Publication Data
US 2011/0241750 A1    Oct. 6, 2011

(30) Foreign Application Priority Data

Nov. 14, 2008  (GB) .................................. 0820814.2

(51) Int. Cl.
*H03B 5/12*    (2006.01)
(52) U.S. Cl.
USPC ....................................... 331/177 V; 331/175
(58) Field of Classification Search
USPC ............... 331/175, 177 V, 158, 160, 182, 109
See application file for complete search history.

(56) References Cited

U.S. PATENT DOCUMENTS

| 5,550,548 A | 8/1996 | Schuermann |
| 6,760,575 B2 * | 7/2004 | Welland ........................ 455/260 |
| 2005/0134435 A1 | 6/2005 | Koyama |

FOREIGN PATENT DOCUMENTS

| EP | 0663724 A2 | 7/1995 |
| GB | 2321726 A | 8/1998 |
| GB | 2419777 A | 5/2006 |
| WO | WO 99/60696 A1 | 11/1999 |
| WO | WO 2005/104022 A1 | 11/2005 |
| WO | WO 2007/068974 A2 | 6/2007 |
| WO | WO 2008/110833 A1 | 9/2008 |

OTHER PUBLICATIONS

International Search Report and Written Opinion of corresponding PCT/GB2009/051406 mailed Feb. 8, 2010.

* cited by examiner

*Primary Examiner* — Joseph Chang
(74) *Attorney, Agent, or Firm* — Wolf, Greenfield & Sacks, P.C.

(57) ABSTRACT

A circuit block which comprises a non-linear capacitor with two different values of capacitance dependent on a value of a voltage of a resonant signal on the capacitor; a plurality of second capacitors each coupled to a respective switch to enable a said second capacitor to be switched in or out of parallel connection with the nonlinear capacitor; and a tuning control, coupled to the second capacitor switches, and sensing an amplitude of the resonant signal. The tuning control circuit is configured to control the second capacitor switches to successively switch the second capacitors in/out of parallel connection with the non-linear capacitor dependent on the amplitude of the resonant signal until the non-linear capacitor has substantially a single one of two different values, such that in a resonant circuit the circuit block then behaves as a fixed value capacitor.

30 Claims, 13 Drawing Sheets

TUNED RESONANT CIRCUITS

FIELD OF THE INVENTION

This invention relates to resonant circuits, and more particularly to circuit blocks and components for resonant circuits and to related tuning methods. Embodiments of the invention are particularly useful in RFID tags.

BACKGROUND TO THE INVENTION

Radio frequency identification (RFID) generally employs resonance in order to increase the efficiency of energy transfer from the reader to the tag. This is achieved through the resonant recycling of energy that results in voltage step up in the tag when subject to the reader powering field. The level of step up increases as the Q of the resonant circuit increases and the loss decreases.

However, as the tag Q increases the width of the resonance drops proportionally. High levels of step up, corresponding to high Q, are only achieved over a narrow frequency band. This makes the system susceptible to degradation due to detuning as follows:

1) Environmental detuning can cause the resonant frequency to shift from the intended frequency. When read at a fixed frequency by the reader then the detuned tag may not derive sufficient power to operate.
2) Variation at manufacture of the resonator components (generally an antenna and capacitor) has a similar effect to environmental detuning and the detuned tag may not derive sufficient power to operate.
3) Mutual coupling between tags can cause their resonant frequencies to shift. The result is again that the detuned tag may not derive sufficient power to operate.

If high levels of detuning need to be tolerated then this limits the Q of the resonator and the range of the tag decreases. Alternatively, if environmental detuning is not an issue then high Q can be used to extend the read range of the tag. However, the accuracy of the resonator components need to be high and this increases the cost of manufacture.

Auto-tuning in RFID is known to compensate for tuning differences. However, to date this has had limited application in a conventional passive tag. The tag needs to be tuned correctly in order to derive the power required to operate from the reader field. When the tag is detuned it cannot derive the power required to operate a conventional tuning circuit and therefore fails to power up.

Patents WO2007068974 and WO2008110833 outline a new method that enables auto-tuning to be used in a passive tag. Rather than being based on a conventional linear resonator, these patents introduce a non-linear resonator with beneficial tuning properties. A circuit is disclosed comprising a self-adaptive resonator that may be operated over a designed band of frequencies, independent of the level of loss. In embodiments this is achieved through the use of an antenna and two capacitive paths that are coupled into the resonance with a variable duty cycle; the duty cycle is controlled by the waveform amplitude and the gate voltage on a MOSFET. One application of this circuit is in a tag where the induced voltage is used to control the mosfet gate voltage and ramp up the amplitude in tag. This arrangement can achieve high levels of voltage step up corresponding to low loss in the antenna resonance, without the drawbacks of a narrow single resonance frequency. In effect the tag has an auto tuning behaviour to the stimulus frequency, provided it is within a designed frequency band. Furthermore, the system may be completely passive without the requirement for a separate power source to operate the tuning circuit. It therefore has application in RFID tags, allowing them to power up in the presence of a reader field, even when they are detuned.

An RFID tag needs to both power up in the presence of a reader field and also to subsequently communicate with the reader. WO2008110833 describes a set of methods for employing the new resonator in a tag. In particular, one method disclosed was to use the new resonator for the initial power up of the tag, but switching to a conventional linear resonator for communication. The advantage of this approach is that the conventional resonator is easier to control turn on and turn off when communicating from tag to reader. Also when communicating from reader to tag, it is easier to detect the envelope changes of a conventional resonator in the tag when the reader field is modulated.

Once power is derived from the reader field then a conventional tuning circuit can also be operated in the tag. The end result after a powering and conventional tuning cycle is a tag that is well tuned to the reader field and able to communicate normally. This can provide a set of benefits over standard tags as follows:

1) Increased tolerance to environmental detuning.
2) Increased tolerance to manufacturing variation
3) Increased tolerance to tag to tag detuning
4) Operation at multiple frequencies, such as 125 kHz and 134 kHz for animal ID.

However, the use of a separate tuning circuit that is switched in instead of the self-adaptive resonator does have some drawbacks. These are:

1) A separate tuning circuit will require additional silicon area that can lead to increases in the cost of the chip used in the RFID tag.
2) The correct setting for the tuning circuit will need to be determined. For example monitoring the envelope of the resonance as a function of the tuning setting takes time, power, and increases the complexity of the silicon. This may increase the cost of the solution and also increase the time required until the tag is in a position to operate fully.

Background prior art can be found in: WO2007/068974; WO2005/104022; and US2005/134234.

There is therefore the requirement for an RFID tag employing a self-adaptive resonator for the power up tuning and a final state of a conventionally tuned linear resonator, but without requiring a significant increase in chip complexity, chip area, and tuning time.

SUMMARY OF THE INVENTION

According to a first aspect of the invention there is therefore provided a circuit block for a resonant circuit, the circuit block having a pair of connections for connection of the circuit into the resonant circuit as a capacitor, the circuit block comprising: a first, non-linear capacitor, said first, non-linear capacitor having two different values of capacitance dependent on a value of a voltage of a resonant signal on the non-linear capacitor; a power supply circuit coupled to said non-linear capacitor to provide a power supply for the circuit block; a plurality of second capacitors each coupled to a respective second capacitor switch to enable a said second capacitor to be switched in or out of parallel connection with said first, non-linear capacitor; and a tuning control circuit powered by said power supply, coupled to said second capacitor switches, and having an input to sense an amplitude of said resonant signal; and wherein said tuning control circuit is configured to control said second capacitor switches to successively switch said second capacitors in or out of said parallel connection with said first, non-linear capacitor dependent on said amplitude of said resonant signal until said first, non-linear capacitor has substantially a single one of said two different values such that in said resonant circuit said circuit block then appears to behave substantially as a fixed value capacitor.

Embodiments of the circuit block provide a so-called IP block for a resonator, replacing a conventional, fixed capacitor. In such an arrangement embodiments of the circuit block provide advantages of a self-adaptive or self-tuning resonator, in particular in the context of an RFID tag, self-tuning to an external (tag reader) signal. This enables the self-tuning circuit to draw power from the external signal to power up the circuit block and, once powered up, the tuning control circuit gradually adjusts the non-linear capacitor of the self-adaptive resonator towards one of its extremal (maximum or minimum) values until the circuit block as a whole has the appearance, to an external circuit (ie the resonator in which it is connected) of a conventional, fixed capacitor. Advantages of using a non-linear capacitor to form a self-adaptive resonator can include one or more of: a combination of a high Q with a broad initial capture range to capture power from the external (radio frequency) signal; the ability to tolerate variations in component values thus, for example, reducing or eliminating the need to tune a capacitor value during manufacture of an RFID integrated circuit; increased tolerance to detuning in a real world environment; and multi-frequency operation (particularly important in the context of RFID tags where multiple different standard frequencies are employed).

In preferred embodiments the first, non-linear capacitor described above comprises a pair of series coupled capacitors with a transistor, in particular a MOSFET, coupled across one of the pair. With such an arrangement the effective average capacitance of the non-linear capacitor can be varied by varying a gate voltage on the transistor. During a cycle of a resonant signal on the capacitor the gate-source voltage varies, turning the transistor on and off so that the capacitance value of the non-linear capacitor depends on the instantaneous value of the resonant signal voltage. This results in an asymmetric resonant signal voltage wave-form with a short, relatively higher amplitude quasi-sinusoidal half cycle when the MOSFET is off (for an N-type MOSFET, when the source voltage is positive with respect to the gate voltage), and a relatively longer, lower amplitude quaisai-sanusoidal half cycle when the MOSFET is on.

We have described above an example of a non-linear capacitor comprising a pair of series coupled capacitors with a MOSFET coupled across one of the pair. The skilled person will, however, appreciate that the values of these capacitors may vary over a wide range, with a corresponding adjustment to the maximum and minimum capacitor values of the non-linear capacitor. This range may include very low values for either capacitor, in which case the MOSFET itself may provide this capacitance and the small capacitor may be omitted as a separate component.

Thus by gradually changing the gate voltage the amplitude of the resonance grows (in the above example by taking the gate voltage more negative), the circuit in effect finding a combination of gate-source voltage variation (signal amplitude) which adjusts the non-linear capacitor to bring the circuit into resonance. Further, adjusting the gate voltage adjusts the operating point of the circuit, in effect adjusting the amplitude of the resonant signal and also the percentage on (or off) time of the MOSFET. In the above example if the gate voltage falls the 'MOSFET on time' as a percentage of the full cycle decreases towards 0% as the amplitude grows; alternatively if the gate voltage becomes more positive again the amplitude can grow but with a 'MOSFET on time' which approaches 100%. At 100% on time one of the series coupled capacitors is shorted, giving a maximum effective capacitance; at 0% on time there is a minimum effective capacitance, given by the capacitance value of the two capacitors in series.

We have described above an example of a non-linear capacitor used in preferred embodiments of the circuit block. The skilled person will, however, appreciate that other types of non-linear capacitor may be constructed and employed in a circuit block according to an embodiment of the invention: the principle of operation of the circuit is not limited to the particular type of non-linear capacitor we describe, or even to non-linear capacitors since, in principle, a non-linear inductor may additionally or alternatively be employed. Non-linear capacitors may be comprised of multiple mosfets and these MOSFETs may be n-type, p-type, or some combination of both types.

In some preferred embodiments of the circuit block the tuning control circuit bleeds power from the resonant signal on the non-linear capacitor and uses this to control the effective average value of the non-linear capacitor, in particular embodiments by controlling the voltage on the gate of the MOSFET. Conveniently this may be achieved by providing a capacitor on the gate of the MOSFET and injecting current (charge) into the capacitor. In some preferred embodiments power bled from the non-linear capacitor is used to charge this capacitor to ramp up the magnitude of the gate voltage of the MOSFET, which in turn ramps up the amplitude of the resonant signal in the circuit. In embodiments this may be achieved using an envelope detector or charge pump coupled to a node of the non-linear capacitor to generate a voltage from which is derived a current to charge the capacitor on the gate of the MOSFET. The charging current may be varied based on the amplitude of the resonator and other waveforms in the non-linear capacitor in order to make the time to ramp up to a threshold level more even over the whole tuning range of the resonator.

In some preferred embodiments the charging current may be generated by two or more separate circuit blocks. The first circuit block may be a start-up circuit, such as a charge pump, that provides a step up voltage from the initial waveform of the resonator, allowing the voltage on the MOSFET capacitor to be increased to a first level. Once the resonator amplitude reaches a start-up threshold the start-up circuit may be switched off. The subsequent charging current may be created by one or more other circuit blocks that do not step up the voltage to the same extent.

The self-adaptive resonator may incorporate a recovery circuit that provides a beneficial behaviour after the self-adaptive resonator fails to operate properly. Example of situations where this might occur include interrogation by a reader field that is not sufficient to ramp the resonator to its operating level. The recovery circuit may cause the resonator to relax to a state that allows it to ramp up again. This may avoid the resonator becoming stuck in a state where it is unable to ramp up.

Preferably the circuit includes a system, for example, a comparator, to inhibit the ramp up of the magnitude of the gate voltage once a threshold target or operating amplitude has been reached. Typically (depending upon the frequency of the external signal) at this point the effective average capacitance of the non-linear capacitor is somewhere between its two extremal values.

The tuning control circuit then switches in or out of the resonant circuit a second capacitor, which may be a conventional, fixed capacitor or another non-linear capacitor of the type described above. This changes the operating point of the circuit, reducing the amplitude of the resonant signal. The circuit then automatically compensates (as described above), finding a new operating point in which the first, non-linear capacitor has a different effective average capacitance (because there is now additional or removed capacitance from the second capacitor). This effectively pushes the first, non-linear capacitor, and the self-adaptive resonator in which it operates towards one end of its operating range. As the amplitude of the resonant signal in the circuit recovers the threshold amplitude is once again reached and a further second capacitor is then switched either in or out of the circuit, pushing the first, non-linear capacitor further towards one or other end of its operating range. This process continues until the MOSFET is substantially either fully on or fully off, at which point the amplitude of the resonant signal is unable to quite reach the target (threshold) amplitude and the circuit remains in a stable configuration. At this point the circuit now has the appearance of a conventional, fixed capacitor.

Where non-linear capacitors are employed as the second capacitor these may be controlled in parallel with the first non-linear capacitor, for example by mirroring a current into the gate capacitor of the first non-linear capacitor to provide currents into gate capacitors of MOSFET's associated with respective second non-linear capacitors. The resulting bias voltage on the gate capacitors of MOSFET's associated with respective second non-linear capacitors need not be substantially the same as the MOSFET associated with the first, non-linear capacitor.

In such an embodiment the second, non-linear capacitors can be switched in or out of parallel connection with the first non-linear capacitor by, for example, clamping the gate voltage on a respective second, non-linear capacitor MOSFET.

The skilled person will recognise that the gate voltage on a MOSFET of a non-linear capacitor in the circuit block may be ramped either up (for example positive from zero) or down (for example negative from zero). However it is preferable that the final operating point of the circuit is one in which the first, non-linear capacitor has a maximum value (that is, its associated MOSFET is substantially fully on), since this gives the most efficient use of the area on a silicon chip devoted to the capacitors (in the circuits described later capacitor C2 is shorted so that capacitor C3 has its maximum effect).

In some embodiments the second capacitors comprise conventional capacitors and are switched in, that is into parallel connection with the first non-linear capacitor, at start-up of the circuit. This may be achieved by connecting each of the second capacitors in series with a MOSFET which is doped such that it is conductive with a gate voltage of substantially zero volts.

In embodiments whether the second capacitors are fixed or non-linear, preferably these are smaller than the minimum effective average capacitance of the first non-linear capacitor (that is smaller than the capacitance of the series combination of the pair of capacitors in this capacitor); in embodiments preferably more than, 2, 3, 4, 5 or 10 such second capacitors are employed. It will be appreciated that the capacitance values in the circuit depend upon the frequency of operation of the circuit and may be selected accordingly. However in one embodiment the second capacitors may comprise of order 10, 5 pF capacitors which are thus able to, when switched out, remove 50 pF from the first, non-linear capacitor. In a typical resonant circuit an additional conventional fixed capacitor (C1 in the circuits later) is also employed coupled across the first, non-linear capacitor.

We have described above an example of the use of a set of second capacitors controlled by a tuning control circuit. The skilled person will, however appreciate that these tuning elements need only be reactive and not necessarily capacitive. Inductors, whether linear or non-linear may additionally or alternatively be employed.

In embodiments of the circuit the ramping of the gate voltage may be limited, for example by a voltage rail of the circuit if the amplitude of a resonant signal within the circuit does not increase above the threshold amplitude. In some applications the amplitude of the external signal may be so high that the target amplitude within the circuit is reached even after all the second capacitors have been switched in or out, but whilst the first, non-linear capacitor is still not at one or other end of its operating range. This may occur, for example, where an RFID tag is close to a tag reader. In such a case the circuit which stops the ramp-up of the gate voltage when the threshold amplitude has been reached may be inhibited, in effect to force the first, non-linear capacitor to one or other end of its range. In this way, even in these circumstances the first non-linear capacitor can have substantially a single value after power-up, and hence behave substantially as a fixed capacitor.

We have described above an example where the end point of the tuning sets the first, non-linear capacitor to one or other end of its range. In alternative embodiments, the end point of the tuning may leave the non-linear capacitor with an average capacitance part way between its maximum and minimum capacitance values. The final setting of the non-linear capacitor may be towards one of the extremal values of the non-linear capacitor. Such a final setting may be beneficial to fine-tune the final amplitude of the resonator towards a target value.

In a related aspect the invention provides a method of using a self-adaptive reactive element in a resonant circuit, said self-adaptive reactive element having a reactive impedance which automatically adjusts to a frequency of a signal applied to said resonant circuit to bring a resonant frequency of said resonant circuit into alignment with said frequency of said applied signal, said reactive impedance of said self-adaptive reactive element varying between a maximum and a minimum value, the method comprising:

deriving a power supply from said resonant circuit; and using said power supply to switch additional reactive impedance in or out of said resonant circuit until said maximum or minimum value of said reactive impedance of said self-adaptive reactive element is reached, such that said self-adaptive element behaves substantially as a non-adaptive reactive element.

The invention also provides a controller for a self-adaptive reactive element, said self-adaptive reactive element having a reactive impedance which automatically adjusts to a frequency of a signal applied to said resonant circuit to bring a resonant frequency of said resonant circuit into alignment with said frequency of said applied signal, said reactive impedance of said self-adaptive reactive element varying between a maximum and a minimum value, the controller comprising:

a circuit to derive a power supply from said resonant circuit; and a circuit to use said power supply to switch additional reactive impedance in or out of said resonant circuit until said maximum or minimum value of said reactive impedance of said self-adaptive reactive element is reached, such that said self-adaptive element behaves substantially as a non-adaptive reactive element In some embodiments at the end point of the tuning said resonant circuit has a resonance substantially matching said frequency of said applied signal. The skilled person will, however appreciate that at the end point of the tuning said resonant circuit need not match said frequency in order to have a beneficial tuning. In particular, if the reader field is high then an increased number of the second capacitors may be switched in or out. The resonant circuit may then have a resonance frequency above or below the frequency of the applied signal. The resonator may be limited by an on-chip regulator and the final tuning of the resonator may reduce the power handling requirement on said regulator. Additional second capacitors may be supplied to increase the difference between said resonator resonance frequency at the end point of the tuning and the frequency of the applied signal. This may further reduce the power requirements for an on-chip regulator or eliminate any requirement for an on-chip regulator.

In a further related aspect the invention provides a tuned circuit component comprising:
- a first capacitor;
- a first MOSFET;
- at least one second MOSFET;
- a second capacitor (C3) coupled in series with said first MOSFET, said series coupled second capacitor and first MOSFET being coupled in parallel with said first capacitor; and
- at least one fourth capacitor coupled in series with said at least one second MOSFET, said series combination of said fourth capacitor and said second MOSFET being coupled in parallel with said first capacitor.

In embodiments the tuned circuit component comprises a plurality of such fourth capacitors each coupled in series with a respective second MOSFET. Optionally a fifth capacitor may be coupled across the or each second MOSFET, in which case the or each second MOSFET may also be provided with a gate capacitor, in a similar manner to the first MOSFET. A charge circuit may be employed to charge the first capacitor on the gate of the first MOSFET, deriving power from a resonant circuit in which the tuned circuit component is connected. An amplitude detect circuit may be employed to detect an amplitude of a signal on the first capacitor. Charging of the gate capacitor of the first MOSFET may then be inhibited when the amplitude exceeds a threshold. Embodiments of the tuned circuit component further comprise a capacitor select circuit coupled to the amplitude detect circuit to switch the or each fourth capacitor in or out of parallel coupling with the first capacitor when the amplitude exceeds a threshold amplitude (in preferred embodiments the same threshold amplitude used to inhibit charging of the first MOSFET gate capacitor). In embodiments the capacitor select circuit includes a delay circuit to inhibit switching of a fourth capacitor in or out of the tuning component until a delay interval after switching a previous fourth capacitor in or out, to provide time for the amplitude of a resonant signal in the circuit to recover. This delay may be implemented, for example, by a counter counting cycles of a resonant signal within the circuit.

In a further aspect the invention provides a self-powered resonant circuit, the circuit comprising:
- at least one self-adaptive resonant circuit, said self-adaptive resonant circuit having a resonant frequency which automatically tunes to a frequency of a signal applied to said self-adaptive resonant circuit;
- a power supply circuit to coupled to said self-adaptive resonant circuit to derive a power supply from a resonant signal in said self-adaptive resonant circuit;
- a plurality of switched reactive elements each coupled to said self-adaptive resonant circuit; and
- a controller to selectively switch said switched reactive elements into said self-adaptive resonant circuit until said self-adaptive resonant circuit has reached substantially a limit of a range of said automatic tuning.

The invention also provides a method of operating a self-powered resonant circuit as described above.

In a further aspect the invention provides a tuned circuit comprising a series coupled pair of capacitors, a first MOSFET coupled across one of said pair of capacitors, a system to change a gate voltage of said first MOSFET dependent on an amplitude of a signal in said tuned circuit, a system to inhibit said changing when a threshold said amplitude is reached, and a system to switch in or out reactive impedance of said tuned circuit when said threshold is reached until said first MOSFET is either substantially fully on or substantially fully off.

In embodiments the state of the tuning control circuit may be stored in digital elements that have memory such as flip flops. This allows the tuning state to be maintained as long as the tag has power retained from the reader. Alternatively the state of the tuning control circuit may be stored in non-volatile memory such as EEPROM. This may be useful if the intention is to compensate for variation at manufacture but further tuning to take into account other application related detuning is not required. In this situation the tuned state of the resonator may be stored permanently such that the tag automatically ramps up to the same final state for subsequent read attempts.

The embodiments may optionally have a 'freeze-in' circuit that is activated on completion of the tuning cycle. The end point may be determined through a time delay or through completion of all the available tuning steps. The 'freeze-in' circuit registers the final tuning state of all the MOSFETs in the self-adaptive resonator and discrete tuning elements. When activated then it fixes the setting of these MOSFETs to their current setting, ensuring that the tuning is not changed unless the tag loses power. This setting may be beneficial when the tag undergoes modulation either for tag to reader communications or reader to tag communications.

The embodiments may optionally undergo a further tuning cycle at any point after completion of the initial tuning. Such a further tuning cycle may compensate for changes in the environment such as metal or other tags close to the resonator, or may be in response to changes in the amplitude of the energising field. Alternatively said further tuning cycle may be carried out after the initial tuning cycle to bring the resonance frequency closer to the frequency of the energising field. This may increase the amplitude of the resonator which may be beneficial in generating a larger or better quality backscatter signal from an RFID tag to an RFID interrogator. The further tuning cycle may switch the second capacitors into or out of the resonator.

In some embodiments a charge current to a non-linear resonator is inhibited when the resonator amplitude reaches a threshold level and the tuning circuit starts to switch additional capacitors into or out of the resonator at the same or a lower level. However, in an alternative embodiment the tuning circuit starts to switch additional capacitors into or out of the resonator without the charge current being limited in response to the amplitude. Switching additional capacitors into or out of the resonator may be sufficient to control the amplitude to a target level on its own without the inhibition of the charging current.

In some preferred embodiments the MOSFET used in a non-linear capacitor is turned on or off for the full duration of the tuning cycle. This is achieved by setting the gate of this MOSFET to a high or a low voltage. This has the advantage that the non-linear capacitor behaves as a linear capacitor, taking on one of its extremal values. In some alternative embodiments the gate of the MOSFET may be instead set to zero volts, which results in a percentage 'on time' of the MOSFET in the region of 50%. Although the resonator does not finish in a state that has the properties of a linear resonator, the final state of the resonator may have a beneficial tuning. In particular it may ramp up to an operating level without requiring further charging of its MOSFET gate.

Broadly we will describe the following:
1. Use of a self-adaptive resonator together with discrete tuning events that take place while the self adaptive resonator is operating.
2. Use of a self-adaptive resonator for the initial power up of the resonator and the discrete tuning events to transition to a linear resonator with a beneficial tuning.
3. The end point of the tuning being a linear resonator with all mosfets in the self adaptive resonator being either 100% on or 0% on.
4. The end point of the tuning still having the self-adaptive resonator in place but at a defined tuning state.
5. Discrete tuning events being separate tuning elements that are coupled into or out of the resonator. These can be capacitors or inductors.
6. A self adaptive resonator that is split into multiple elements.
7. Use of these multiple elements in parallel for the initial powering of the resonator.
8. Discrete tuning events being to set the multiple elements sequentially to either 100% or 0% of the duty cycle of MOSFET conduction.

BRIEF DESCRIPTION OF THE DRAWINGS

These and other aspects of the invention will now be further described, by way of example only, with reference to the accompanying figures in which.

DETAILED DESCRIPTION OF EMBODIMENTS

Figure 1:
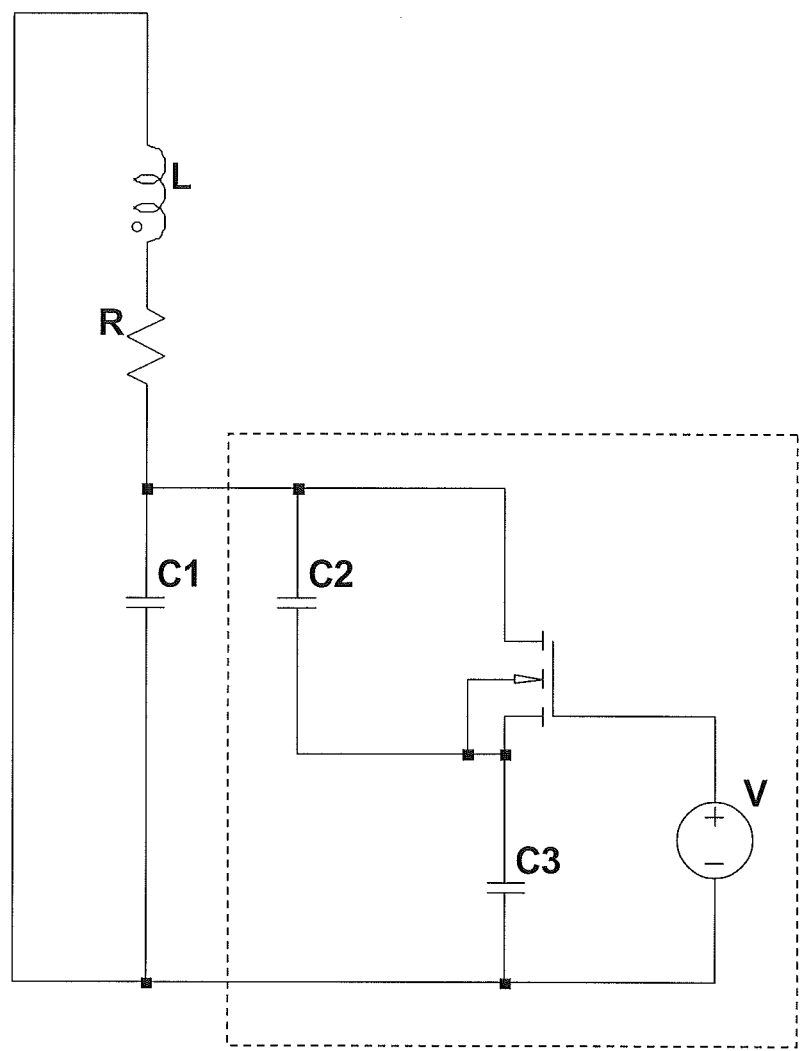
FIGS. 1, 1B, 1C show embodiments of a self-adaptive resonator.

FIG. 1 shows an embodiment of a self-adaptive resonator. The resonator consists of an antenna L with series resistance R coupled to a capacitive network. The antenna is connected to a capacitive network C1, C2, C3 and a MOSFET. The capacitive network has two distinct states with the MOSFET on and MOSFET off. When the MOSFET is on the total capacitance is C1+C3, since C2 is shorted out, whereas when the MOSFET is off the total capacitance is reduced since C2 and C3 are now in series. The MOSFET is turned on or off depending on the amplitude of the waveform at the source potential, relative to the fixed gate voltage V. The duty cycle of the MOSFET turn on time varies with the resonance amplitude, which naturally adjusts to allow the resonator to match the stimulus frequency.

The amplitude of the resonator is controlled through the gate voltage V. If the voltage is reduced to negative voltages then the amplitude increases provided the frequency is between the following limits:

$$f_{50\%} = \frac{1}{\pi\left(\sqrt{L \cdot (C1 + (C2^{-1} + C3^{-1})^{-1})} + \sqrt{L \cdot (C1 + C3)}\right)} \quad \text{EQ (1)}$$

$$f_{0\%} = \frac{1}{2\pi\sqrt{L \cdot (C1 + (C2^{-1} + C3^{-1})^{-1})}} \quad \text{EQ (2)}$$

These limits set the duty cycle of MOSFET conduction between 0% and 50%. If the voltage is increased to positive voltages then the amplitude increases provided the frequency is between the following limits:

$$f_{50\%} = \frac{1}{\pi\left(\sqrt{L \cdot (C1 + (C2^{-1} + C3^{-1})^{-1})} + \sqrt{L \cdot (C1 + C3)}\right)} \quad \text{EQ (3)}$$

$$f_{100\%} = \frac{1}{2\pi\sqrt{L \cdot (C1 + C3)}} \quad \text{EQ (4)}$$

These limits set the duty cycle of MOSFET conduction between 50% and 100%. The advantage of this option is that it makes more effective use of the capacitance that is available and can tune to a lower frequency for a given total capacitance. This can reduce the cost of implementation in silicon as the final cost is directly related to the chip area used.

Figure 1B:
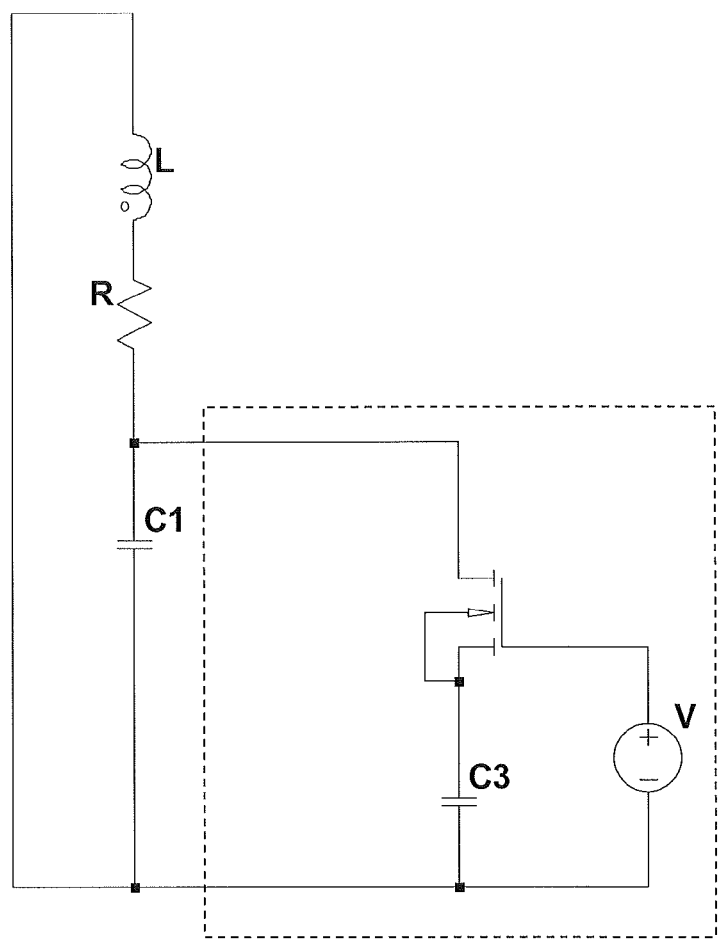

FIG. 1B shows a further embodiment of a self-adaptive resonator. Here the capacitor C2 has been reduced in magnitude to such an extent that the drain-source capacitance of the MOSFET itself takes its place. In this situation C2 is not shown explicitly in the schematic.

Figure 1C:
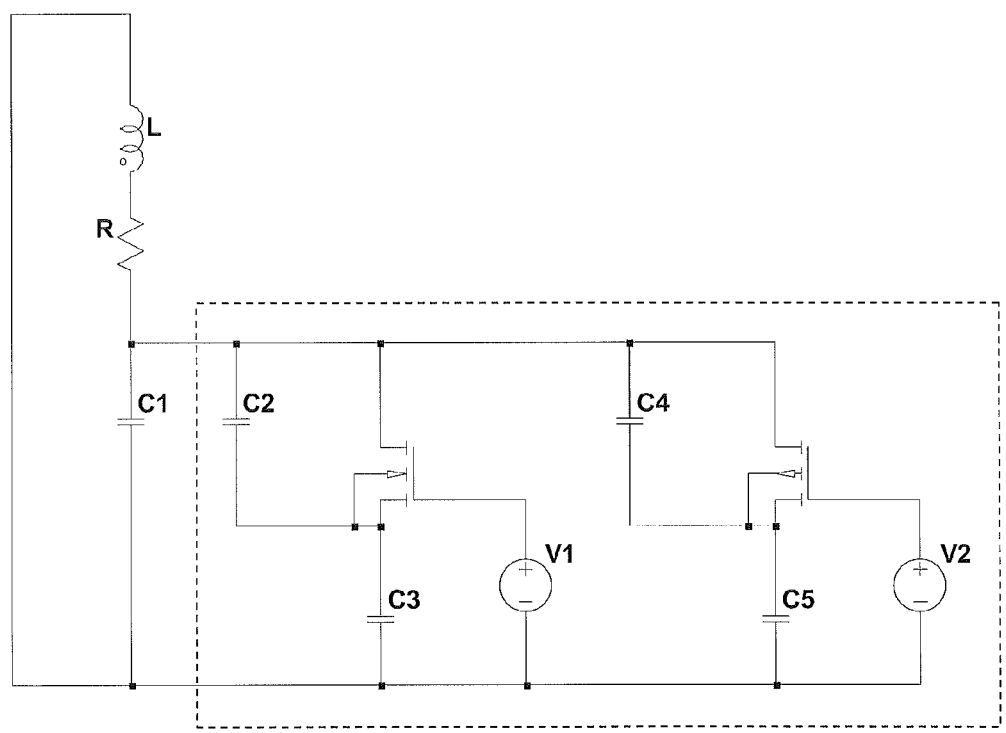

FIG. 1C shows a further embodiment of a self-adaptive resonator where both an n-type and a p-type MOSFET have been employed in separate branches. This resonator may have the advantage of a more symmetric oscillatory waveform.

In FIG. 1 and subsequent figures, a circuit block is indicated by a dashed box. The circuit block has a pair of connections for connection of the circuit into the resonant circuit as a capacitor.

Figure 2:
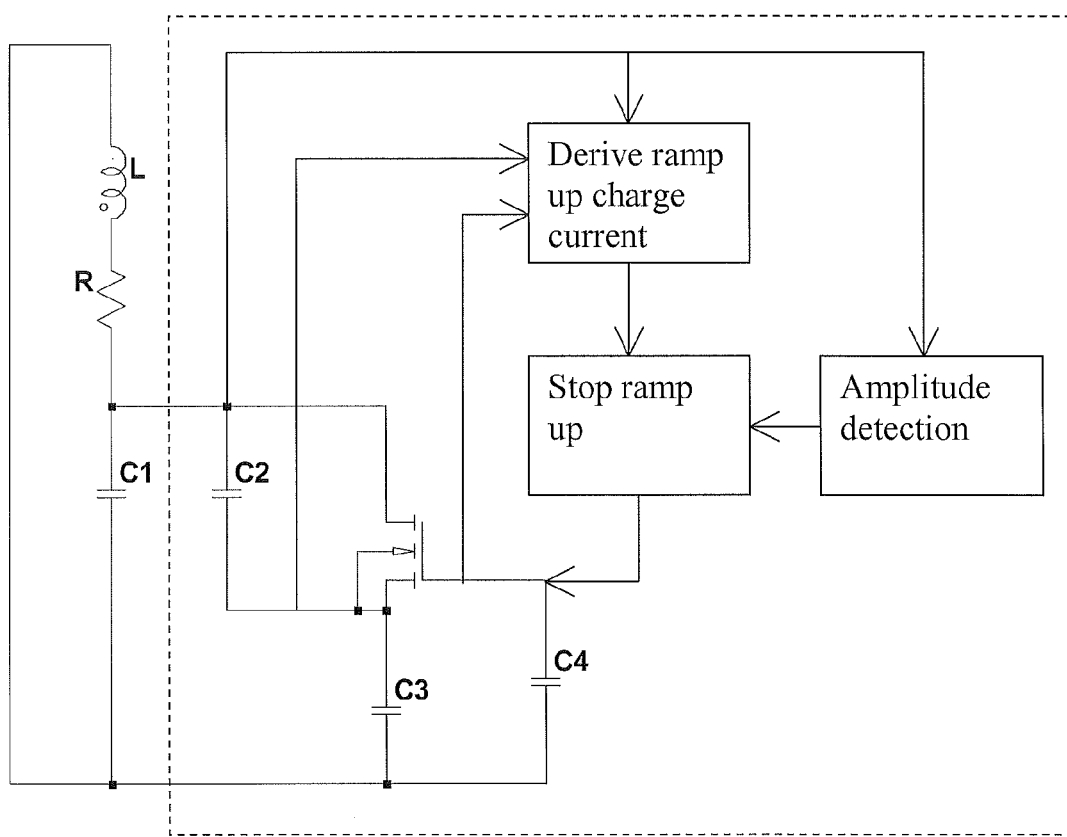
FIG. 2 shows a block diagram of a self-adaptive resonator including automatic ramp up of the resonator to a threshold level.

FIG. 2 shows a block diagram of a self-adaptive resonator with an automatic ramp up circuit. The voltage on the MOSFET gate is stored with a capacitor C4. The automatic ramp up consists of 3 main blocks that are now described.

The first block 'Derive ramp up charge current' takes as its input the resonance voltage from the resonator. This block generates a dc current that is used to charge C4. The current may depend on the amplitude of the resonator and/or the tuning of the resonator. The tuning of the resonator is determined from the input waveforms of the resonance voltage, the voltage on the MOSFET gate, and the voltage on C3. This first block may also include a start-up circuit that provides an initial boost to the voltage on C4 when the resonator is first started and the amplitude is low.

In order to achieve a more even ramp up time to a threshold voltage the charge current to C4 may depend on the activation frequency within the tuning range of the resonator.

Figure 2B:
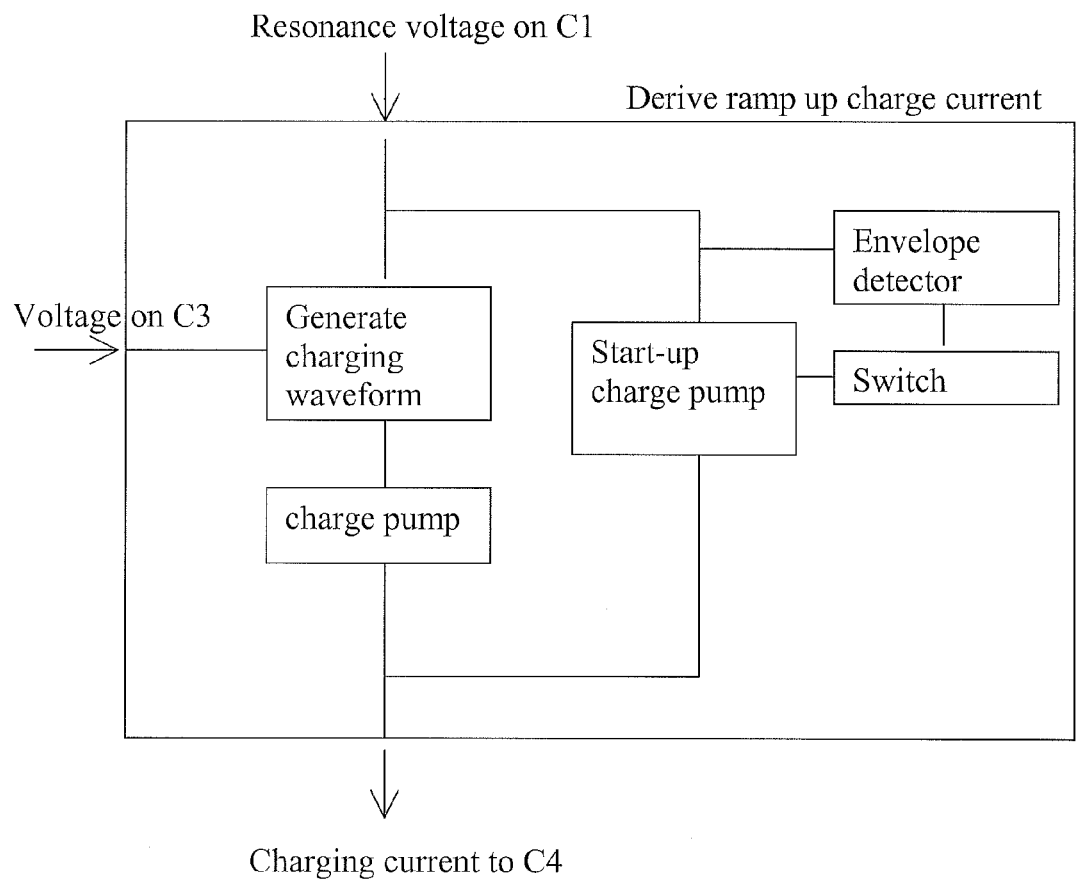
FIG. 2B shows further detail on the composition of the circuit block 'Derive ramp up charge current'.

For example if the voltage on C3 is high and the voltage on C4 is also high then the resonator is close to one end of the tuning range and the charging current should be relatively high. However, if the voltage on C3 is low and the voltage on C4 is high then the resonator is close to the opposite end of the tuning range and charging current should be relatively low. FIG. 2B illustrates this process included in the block 'Derive ramp up charge current' together with other components of this block. A charging waveform is generated by comparing the voltage on C1 and C3. This waveform is passed into a charge pump to provide a charging current with the above characteristics. A separate branch that acts as a start-up circuit is also shown. This is a separate charge pump that is turned off when the envelope detector exceeds a threshold level.

The current supplied by 'Derive ramp up charge current' is passed through the second block 'Stop ramp up'. This block stops the charge of C4 when the amplitude of the resonator has reached a threshold voltage. The third block 'Amplitude detection' determines when this threshold has been reached.

Figure 3A:
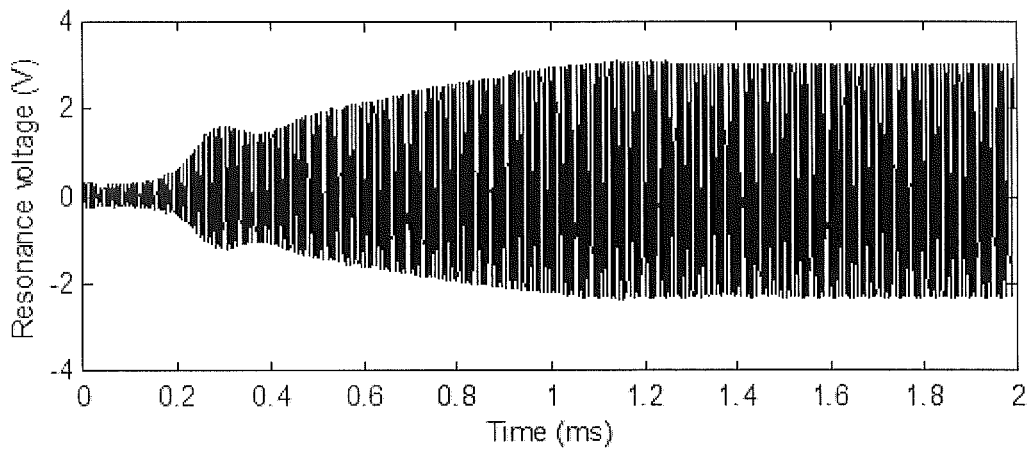
FIG. 3 shows voltage waveforms for a typical self-adaptive resonator that undergoes ramp up to a threshold level.
Figure 3B:
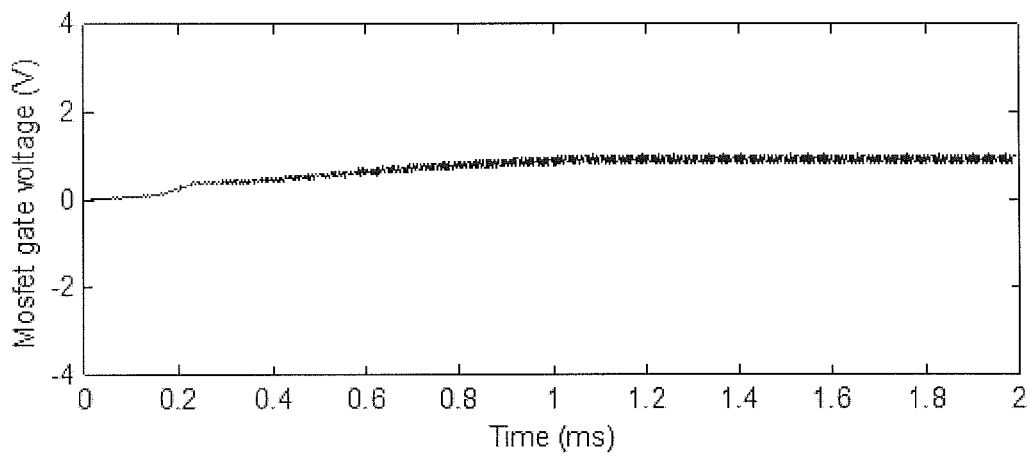
Figure 3C:
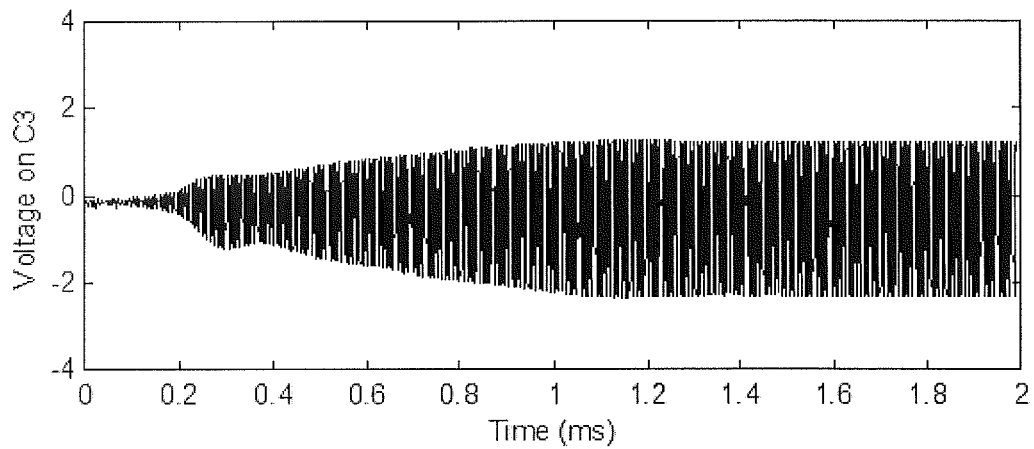

A typical set of waveforms for the ramp up of a resonator are shown in FIG. 3. FIG. 3A shows the resonance voltage as a function of time. FIG. 3B shows the corresponding voltage on C3, and FIG. 3C shows the voltage on the mosfet gate C4. In this example C1 is 95 pF, C2 is 47 pF, C3 is 143 pF, and L is 8 mH. The frequency of the energising field is 125 kHz. Note that because the waveforms oscillate on a timescale that is short compared to the duration of the ramp up the traces appear solid and the envelope of the oscillation is clear.

Figure 4A:
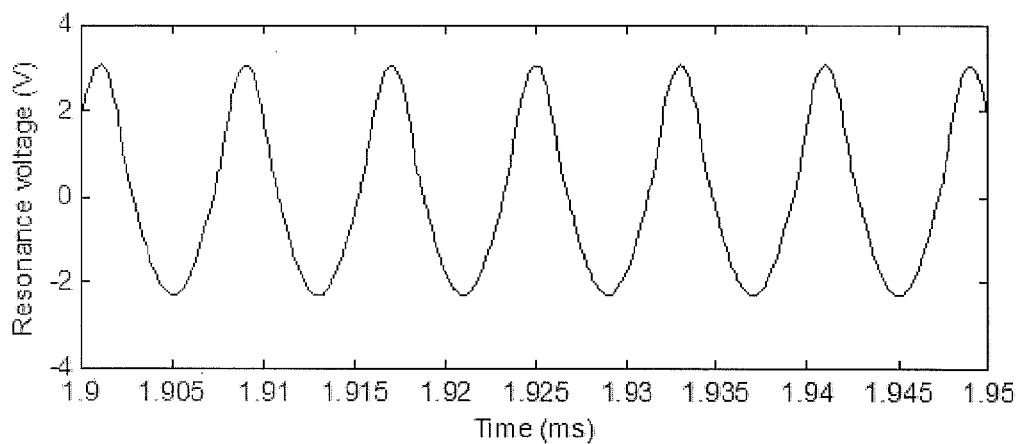
FIG. 4 shows the steady state voltage waveforms for a typical self-adaptive resonator that has undergone ramp up to a threshold level.
Figure 4B:
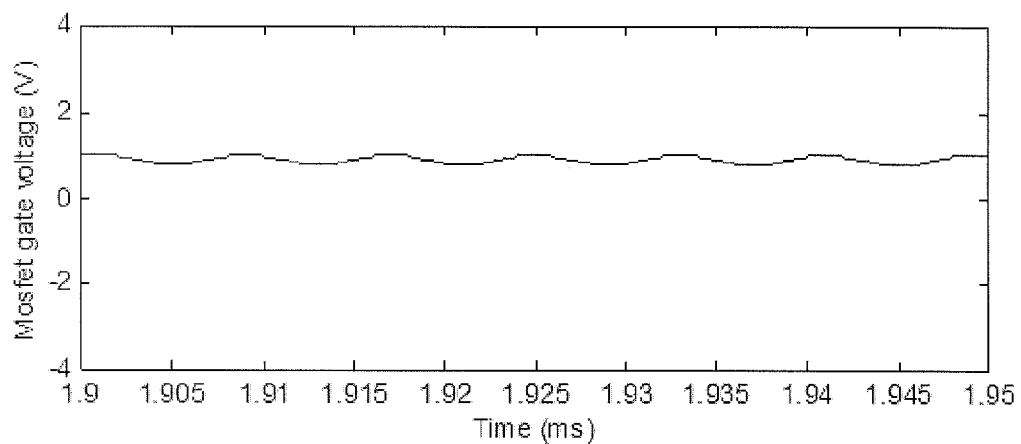
Figure 4C:
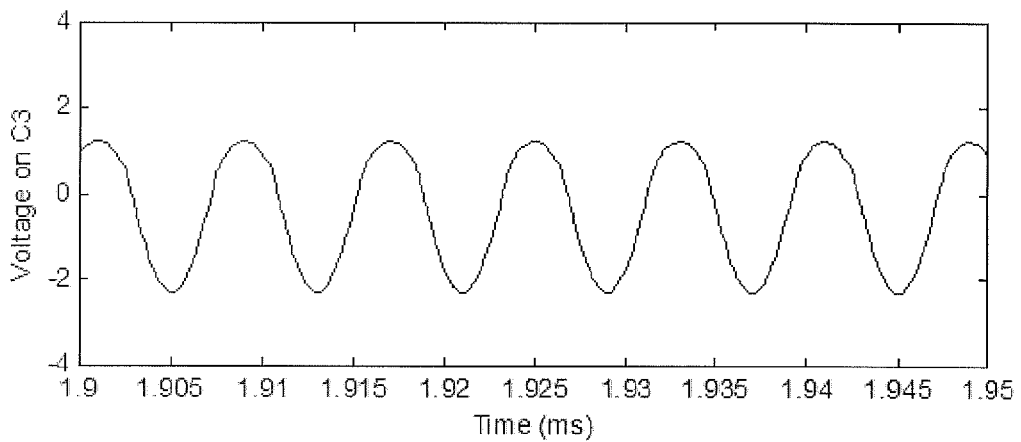

Once the resonator reaches approximately 3V the ramp is complete and the charging of C4 is stopped. The steady state operation of the resonator is now at a constant amplitude and the MOSFET is turned on for a fraction of a full cycle between 50% and 100%. FIG. 4 shows the steady state voltage waveforms zoomed in for clarity.

Figure 5:
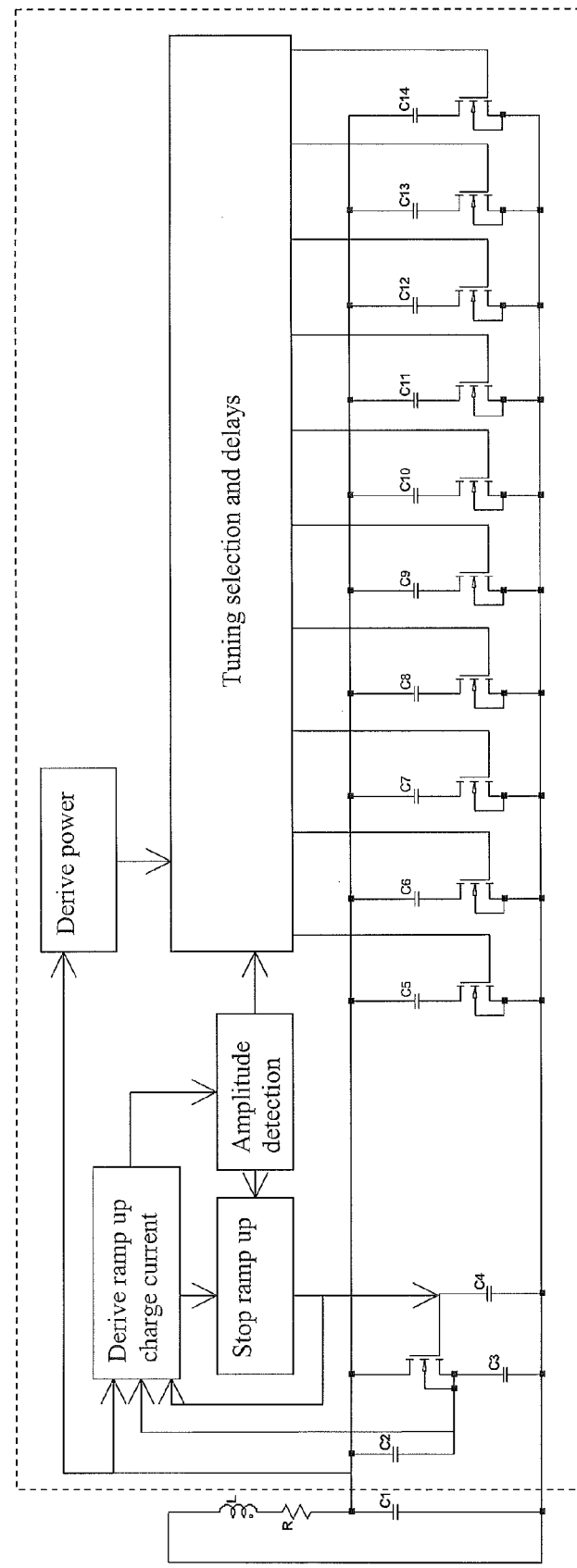
FIG. 5 shows an embodiment of a self-adaptive resonator with additional tuning elements.

FIG. 5 shows an embodiment of a self-adaptive resonator with additional tuning elements. The new tuning elements consist of capacitors C5 to C14, which each have a MOSFET that may be switched to couple them into or out of the resonance. In this embodiment the additional tuning MOSFETs are designed to be conducting at zero source-drain voltage, and require a negative source-drain voltage to be turned off. The operation of the system is now described.

When the tag is placed in the field generated by a reader then the resonator automatically ramps up through the gradual increase of the voltage on C4. When the amplitude reaches an amplitude threshold level then the increase in amplitude is stopped. Also, once the amplitude reaches a tuning threshold level then this is communicated from block 'Amplitude detection' to 'Tuning selection and delays'. In this embodiment the amplitude threshold level and the tuning threshold level are the same, however this need not be the case. The tuning threshold level is generally equal or below the amplitude threshold level.

The block 'Tuning selection and delays' is powered from the resonance via the block 'Derive power' and contains a digital counter clocked at the 125 kHz reader field. The digital counter increments when the amplitude exceeds the tuning threshold level. When the counter reaches 64, which corresponds to 0.512 ms, then the gate voltage of the first tuning mosfet is switched to negative voltages and the counter is re-set. This switches C5 out of the resonator and the total capacitance in the resonator is reduced accordingly.

The self-adaptive resonator now continues to adjust its amplitude, which may now have dropped with the new tuning point of the resonator. The bias on the MOSFET of the self-adaptive resonator is further increased to positive voltages and the resonance ramps up again to the tuning threshold level. At this point the process repeats and the next tuning mosfet is switched when the counter reaches 64. At this point the C6 is no-longer coupled into the resonance and the process repeats.

The delay generated by the counter is required in order for the self adaptive resonator to respond to each new tuning point.

The process repeats until the amplitude no-longer reaches the tuning threshold level. At this point the counter in the block 'Tuning selection and delays' stops incrementing and no further changes to the tuning elements C6 to C14 are carried out. Also because the tuning threshold level has not been reached the block 'Stop ramp up' does not stop the ramp up of the voltage on the gate of the self-adaptive resonator MOSFET. This voltage continues to rise to positive voltages such that this MOSFET ends up always turned on.

This is the final tuning point of the resonator, where the MOSFET in the self-adaptive resonator is turned on 100% and the discrete tuning elements are also turned on by either 100% or 0%. The final tuning point is therefore a linear resonator.

Figure 5B:
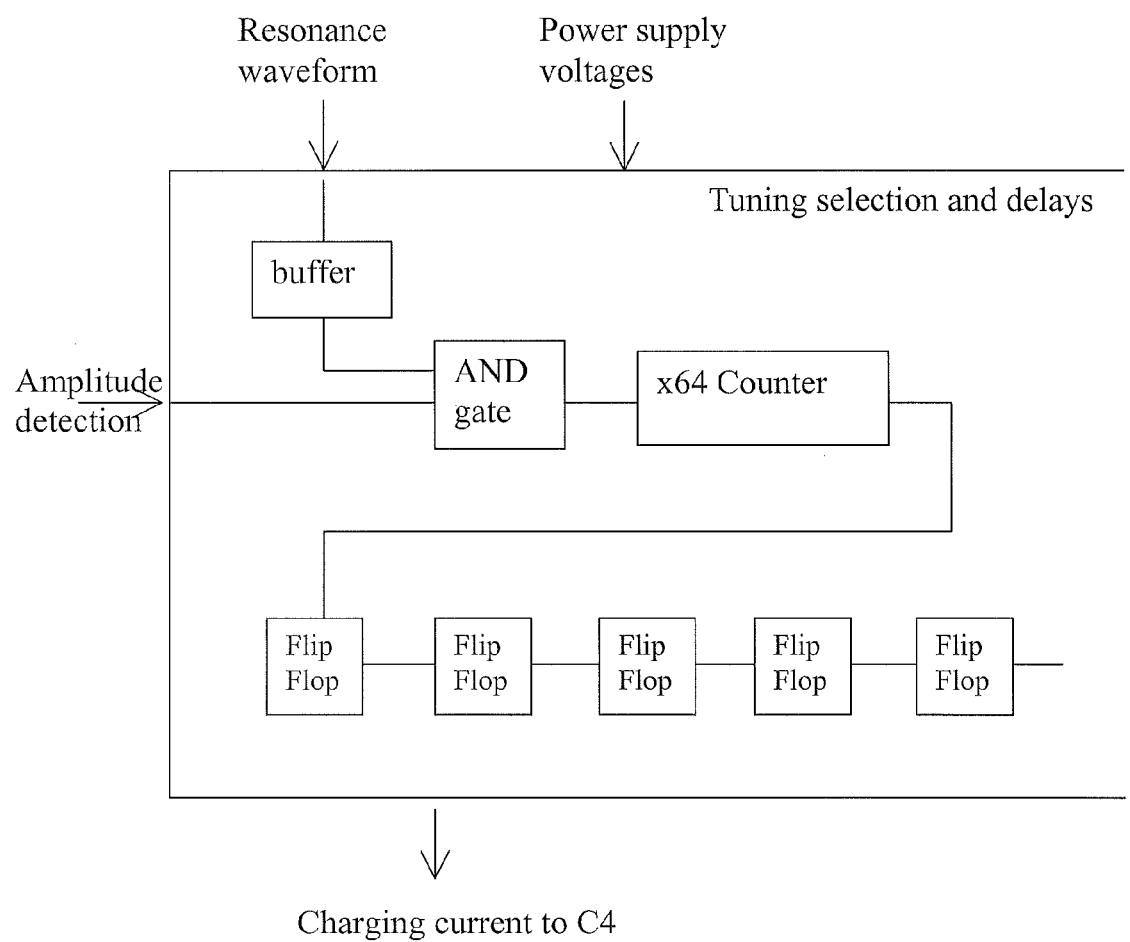
FIG. 5B shows further detail on the composition of the circuit block 'Tuning selection and delays'.

FIG. 5B shows example circuit blocks within the block 'Tuning selection and delays'. This block has one input at logic level from 'Amplitude detection' and two inputs from 'Derive power'. The first of these is the resonance waveform and the second a power voltage derived from the resonance waveform. The power voltage powers the digital circuit elements in 'Tuning selection and delays'. The resonance waveform is first buffered and converted into a digital clock. This clock is gated by the input from 'Amplitude detection' in an AND gate and is only passed on to the counter when the input from 'Amplitude detection' is at logic 1, indicating that the tuning threshold level has been reached. When the counter cycles round every 64 cycles then the flip flops are sequentially switched. These in turn switch the states of the MOSFETs.

FIG. 6 shows the waveforms from an embodiment of the circuit shown in FIG. 5. Here the choice of components is C1=45 pF, C2=47.5 pF, C3=143 pF, and each of C5 to C14 is 5 pF. L is 8 mH. The total capacitance made up from C1 in parallel with C5 to C14 is 95 pF and so this example is similar to the previous embodiment at startup when each of the separate tuning mosfets is turned on.

Figure 6A:
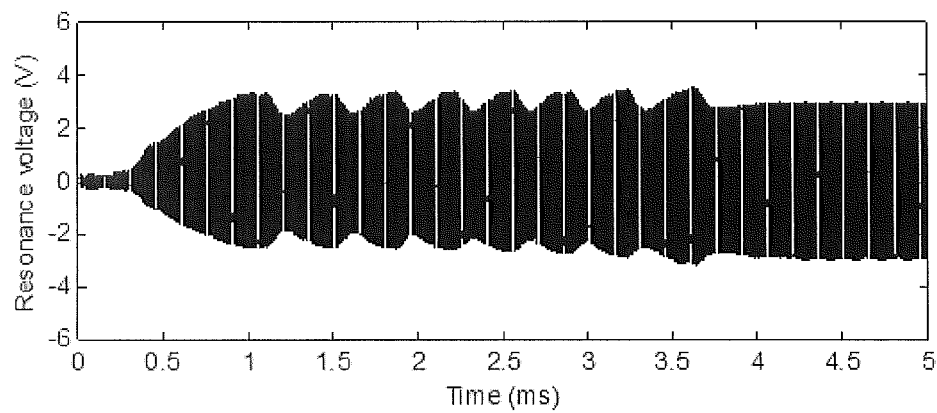
FIG. 6 shows voltage waveforms for a self-adaptive resonator with additional tuning elements.

FIG. 6A shows the resonance voltage waveform. This ramps up to around 3V at 1 ms from turn on of the reader field. At this point the discrete tuning process is started and each tuning step where a discrete tuning MOSFET is turned off is marked by a transient drop in the resonance amplitude. The self adaptive resonator adjusts the amplitude back up to the 3V limit after each transition until the final transition around 3.7 ms. At this point the resonator remains below the tuning threshold level and the amplitude stays constant. This is the final tuned state of the system.

Figure 6B:
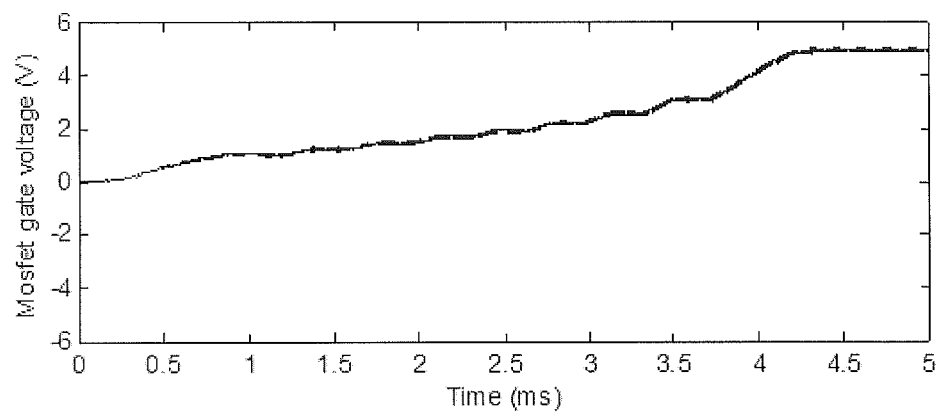
Figure 6C:
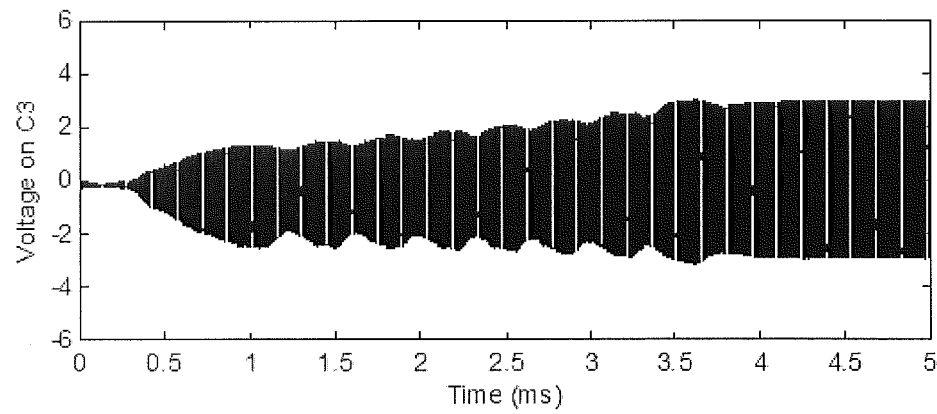

FIG. 6B shows the corresponding waveform for the voltage on the MOSFET of the self-adaptive resonator. Over the first 1 ms this increases from 0V to around 1V, which is responsible for the initial ramp of the resonance amplitude. With each tuning step the gate voltage is further adjusted to higher voltages. With the final tuning step the gate voltage is allowed to increase to its maximum level of around 5V. The MOSFET in the self-adaptive resonator is now completely turned on for 100% of a full cycle and the resonator behaves as a linear resonator. The corresponding graph for the voltage on C3 is shown in FIG. 6C.

The number of tuning steps in this embodiment is purely by way of example. A smoother tuning process may be achieved with a larger number of smaller tuning capacitors. This can also result in greater uniformity of the final amplitude of the resonator after the discrete tuning steps are complete. With smaller tuning steps the delay between each step may also be reduced.

In summary this embodiment enables a self adaptive resonator to power up in the presence of a reader field, even when significantly detuned. It also enables a transition to a linear resonator with a tuning that maintains the resonator amplitude. This may subsequently be used for communication similar to a conventional RFID tag.

Figure 7:
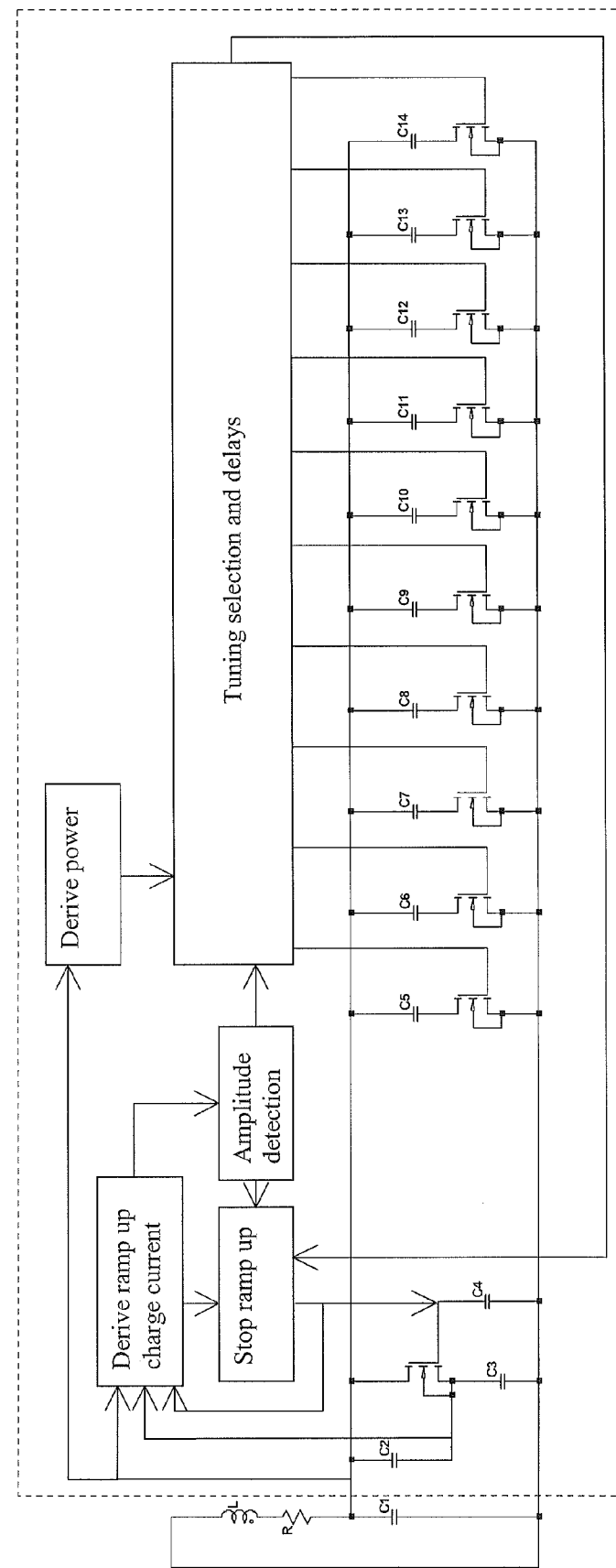
FIG. 7 shows an embodiment of a self-adaptive resonator with additional tuning elements and an extra connection that allows the operation of block 'Stop ramp up' if each of the discrete tuning events are complete.

FIG. 7 shows a block diagram of an embodiment with an extra output from the 'Tuning section and delays' to the 'Stop ramp up' block. This extra output inhibits operation of the 'Stop ramp up' block and allows the gate voltage on the self-adaptive resonator MOSFET to continue to increase, even if the tuning threshold level has been reached. The result is that the MOSFET of the self-adaptive resonator is eventually turned on for 100% of a cycle and the resonator acts as a linear resonator. This control has an advantage when the tag is placed in a reader field that is significantly larger than that required to read the tag. The operation is as follows.

When the tag is placed in a large reader field then it quickly ramps up to the tuning threshold voltage. Each of the tuning mosfets may be turned off sequentially and the resonator may still ramp up to the tuning threshold level. At this point the self-adaptive resonator is still operational and does not behave as a linear resonator. This may cause unwanted behaviour when modulation for tag to reader or reader to tag communications takes place. However by allowing the MOSFET gate voltage to continue to rise the amplitude of the resonator rises until this gate voltage exceeds the resonance amplitude. At this point the resonator is a linear resonator. The increase in amplitude above the tuning threshold level may be limited by an on-chip regulator, similar to a conventional tag.

Figure 8A:
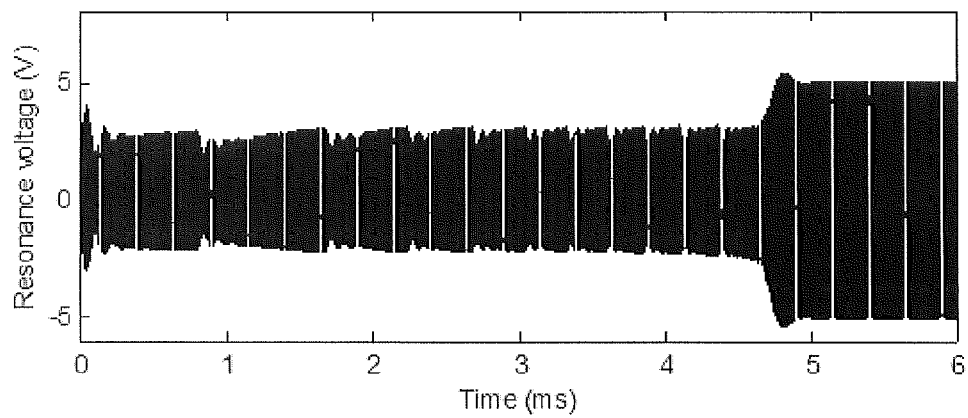
FIG. 8 shows voltage waveforms for a self-adaptive resonator with additional tuning elements and an extra connection that allows the operation of block 'Stop ramp up' if each of the discrete tuning events are complete.
Figure 8B:
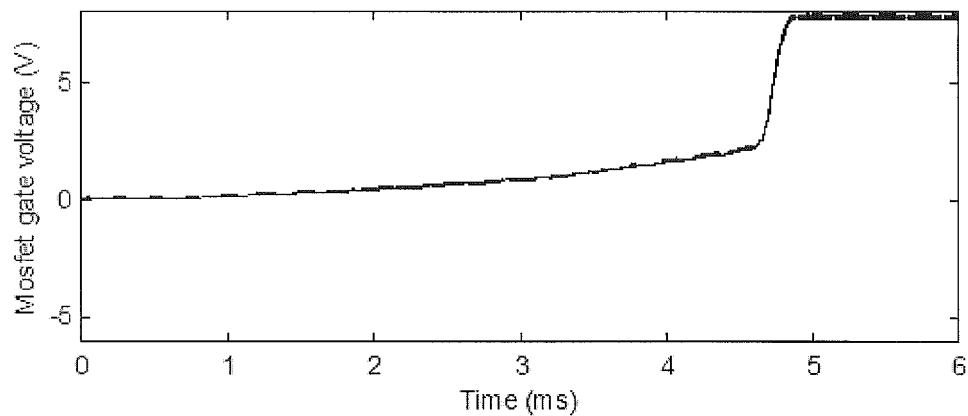
Figure 8C:
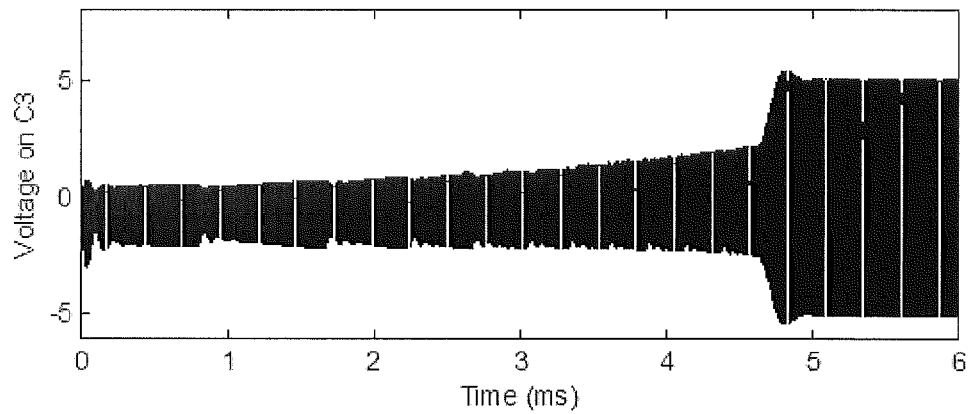

Voltage waveforms for an embodiment that includes this extra switch are shown in FIG. 8. FIG. 8A shows the resonance voltage, FIG. 8B shows the gate voltage on the self-adaptive resonator MOSFET, and FIG. 8C shows the voltage on C3. Here the reader field had been increased by approximately a factor of 4 over previous embodiments. It is clear that the discrete tuning events all complete without limiting the amplitude of the resonator. However after the final tuning event the gate voltage of the self-adaptive resonator is allowed to continually increase until the final state of the resonator is reached.

One advantage of this embodiment is that it does not require a large increase in the chip area that is required for the resonance capacitors and tuning capacitors. The low frequency limit of the resonance tuning is set by the maximum capacitance that can be coupled into the resonator. This corresponds to a final state where the discrete tuning elements are all left coupled into the resonator and the MOSFET in the self-adaptive resonator is coupled in for 100% of the full cycle. This state makes effective use of the on-chip capacitance with very little requirement for extra silicon area over a conventional linear resonator designed to resonate at the same frequency. The benefits of the wide tuning range should therefore be achieved without a large increase in the cost of the tag silicon.

In another embodiment the self-adaptive resonator MOSFET has its gate voltage automatically reduced to negative values. In this setup the duty cycle for this MOSFET conduction is between 50% and 0%, decreasing as the gate voltage is made more negative. Equations (1) and (2) give the frequency limits as a function of C1, C2, and C3. This setup makes less effective use of the available capacitance on chip, and the low frequency limit is set when the duty cycle for MOSFET conduction is 50%, requiring larger on-chip capacitors for the same low frequency limit as the earlier embodiment. However, if the area required for on-chip resonance capacitance is small compared to the total chip area then this method may not have any significant disadvantage.

In this embodiment where the resonator is designed for a negative ramp of the MOSFET gate voltage, the setup for the discrete tuning capacitors is also different. Here the MOSFETs that couple the discrete tuning capacitors C5 to C14 into the resonator are conventional MOSFETs that are turned off at zero source-drain voltage. At each discrete tuning event the discrete tuning MOSFETs are turned on, coupling the discrete tuning capacitor into the resonance. The resonator continues to adjust its level, reducing the gate voltage of the self-adaptive resonator to negative voltages and reducing the percentage duty cycle for conduction of the self adaptive resonator MOSFET. This process continues until the gate voltage is below the minimum voltage of the resonance waveform. At this point the duty cycle for this MOSFET conduction is 0% and all the MOSFETS in the tuning are either 100% on or off. The result is a tuned linear resonator similar to the earlier embodiments.

At start up the discrete capacitors in this embodiment are not coupled into the resonator and do not influence the tuning range for the resonator. They therefore require a further increase in chip area which could translate to increased costs of the final tag silicon. This arrangement may be suitable for applications where the chip area required for resonance capacitors is low compared to the total chip area.

Figure 9:
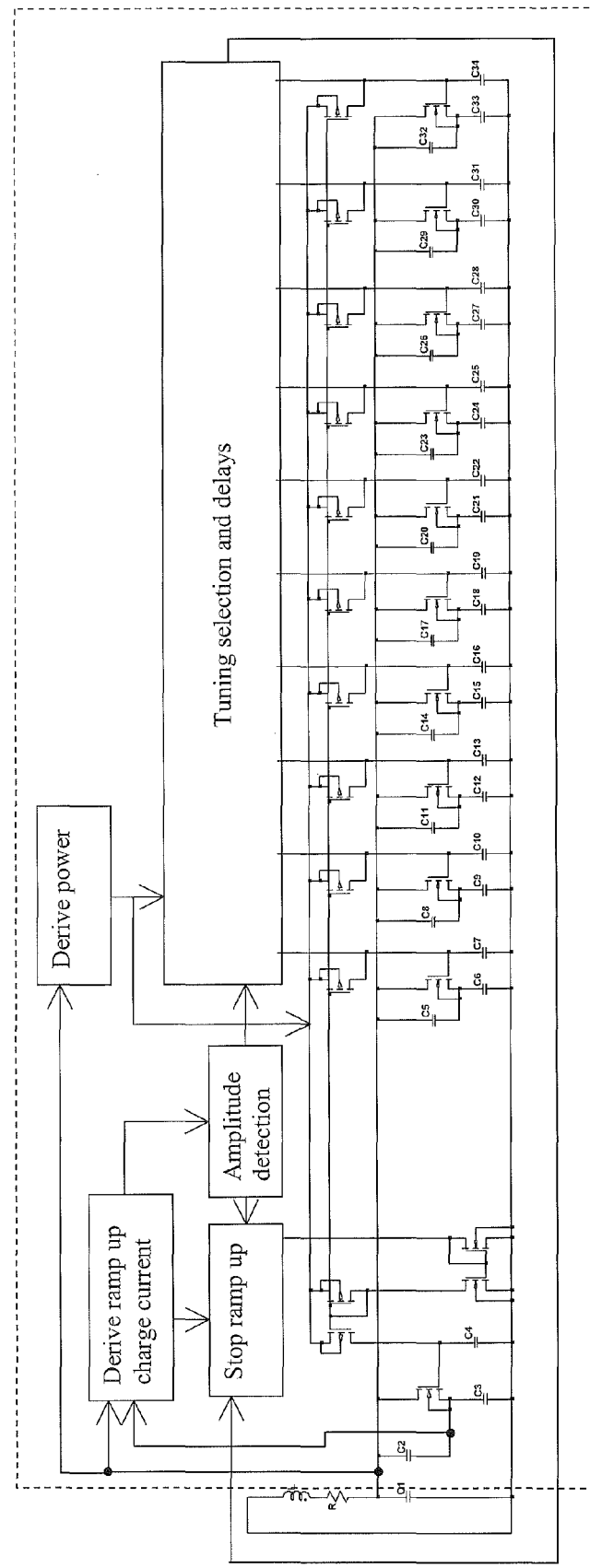
FIG. 9 shows an embodiment where the self-adaptive resonator has been split into multiple elements and where some of these elements are used as discrete tuning elements once the resonator has ramped up.

FIG. 9 shows an embodiment with a different setup for the discrete tuning elements. Rather than using a set of single capacitors with MOSFET switches, this embodiment has part of the self-adaptive resonator in each discrete tuning element. The single branch consisting of two capacitors and a MOSFET that was used in the earlier embodiments to implement a self-adaptive resonator has been split into a set of similar elements. In this embodiment the original MOSFET and capacitors are reduced in area by a factor of 2. The additional elements have the same architecture but their MOSFET and capacitors are reduced in area by a factor of 20. Operation of this circuit is now described.

At start up of the resonator all the similar branches that implement the self adaptive resonator are used in parallel. A set of current mirrors act to mirror the charging current into C4 across the charging currents to each of the capacitors on the MOSFET gates. Because of the ratios chosen for the capacitive and MOSFET areas, the combined effect of these elements when used in parallel is very similar to the earlier embodiments. Furthermore there is no requirement for a significant increase in silicon area. The bias voltage on all the MOSFET gates is gradually increased to positive voltages and the resonator ramps up in the normal way. When the resonator reaches the tuning threshold voltage then the counter in the 'Tuning selection and delays' block is activated, as with previous embodiments.

When a discrete tuning event is activated the gate voltage for the corresponding MOSFET is reduced to negative voltages. Before this is done, the MOSFET in that branch would have been turned on for a percentage of a full duty cycle between 50% and 100%. After this is done the MOSFET is conducting for 0% of a full cycle, and the capacitance coupled into the resonator by this branch is reduced.

After each tuning event the self-adaptive resonator continues to operate. Each of the MOSFETs that has not been switched by a discrete tuning event is still used in parallel in the self-adaptive resonator. The gate voltage on each of these MOSFETs is increased and the duty cycle for the conduction of these MOSFETs is reduced. This process continues until each of the MOSFETs is either set to 0% conduction through a discrete tuning event or is set to 100% conduction through the increase in gate voltage caused by the automatic ramp up of the resonator.

If the reader field is high then the discrete tuning steps may all have been completed and the self-adaptive resonator is still operational. The same switch as earlier embodiments is included for this case where the 'Stop ramp up' block is disabled upon completion of the discrete tuning events. This allows the resonator to ramp up to higher amplitudes and the tuning process to complete with all mosfets set to 0% or 100% conduction i.e. a linear resonator. An on-chip regulator may control the amplitude of the resonator under these circumstances.

The embodiment described above has similar benefits to earlier embodiments. One advantage is that makes efficient use of the available silicon area in a similar manner to the earlier embodiment with a positive bias on the self-adaptive resonator MOSFET gate. However this example does not require use of different MOSFETs in the discrete tuning elements. Here the MOSFETs are of a similar type to all the other MOSFETs and do not require to be conducting at zero gate-source bias. This may be more suitable for the manufacturing process used.

The embodiment described above is purely by way of example. Other alternatives include different numbers of branches into which the main self-adaptive resonator is split. These branches may have varying relative sizes. The adjustment of the gate voltages on each of these branches do not have to be in parallel, as described above. Instead a bias may be applied to each of these MOSFETs at different charging rates, or some of the branches may be not charged. For example some of the discrete tuning branches may be kept at zero gate voltage until they are switched in a discrete tuning event.

In an alternative embodiment the block 'Tuning selection and delays' switches the gate voltages of the MOSFETs to zero volts instead of to negative voltages. When a discrete tuning event is activated the gate voltage for the corresponding MOSFET is reduced to negative voltages. Before this is done, the MOSFET in that branch would have been turned on for a percentage of a full duty cycle between 50% and 100%. After this is done the MOSFET is conducting in the region of 50% of a full cycle, and the capacitance coupled into the resonator by this branch is reduced.

In an alternative embodiment then the bias on each of the separate MOSFETs of the self-adaptive resonator elements may charge the gates to negative voltages. In this case the same setup as the previous embodiment may be in place with parallel operation of the separate branches of the self-adaptive resonator. However, the discrete tuning events now require the MOSFET gates to be switched to high voltages in order to couple the MOSFET into the resonator for 100% of a full cycle. This modifies the tuning of the resonator, increasing the total capacitance in the resonator. The remaining self-adaptive elements of the resonator result in continued charging of their gate voltage to negative voltages, reducing the duty cycle of MOSFET conduction. The final state is a number of discrete tuning elements with their MOSFETs set for 100% duty cycle conduction and the remaining MOSFETs set for 0% duty cycle.

The embodiments may optionally have a 'freeze-in' circuit that is activated on completion of the tuning cycle. The end point may be determined through a time delay or through completion of all the available tuning steps. The 'freeze-in' circuit registers the final tuning state of all the MOSFETs in the self-adaptive resonator and discrete tuning elements. When activated then it permanently sets these MOSFETs to their current setting, ensuring that the tuning is not changed unless the tag loses power. This setting may be beneficial when the tag undergoes modulation either for tag to reader communications or reader to tag communications.

The final tuning state of the resonator may be stored in non-volatile memory such as EEPROM. This may be useful if the intention is to compensate for variation at manufacture but further tuning to take into account other application related detuning is not required. In this situation the tuned state of the resonator may be stored permanently such that the tag automatically ramps up to the same final state for subsequent read attempts.

The embodiments described contain a final switch that upon completion of all the discrete tuning events acts to stop operation of the block 'Stop ramp up'. This can result in beneficial behaviour for high reader fields, where the final amplitude is allowed to increase above the tuning threshold level and may subsequently be limited by an on-chip regulator. Through this process the final state of the resonator is still a linear resonator, and can therefore be used for communications. In an alternative embodiment, the number of discrete tuning elements is increased and this allows the block 'Tuning selection and delays' to continue to adjust the resonator tuning until the tuning threshold level is not reached. The advantage of this process is that the on-chip regulator may have reduced power handling requirements, which may save chip area. Alternatively there may be no requirement for an on-chip regulator.

The embodiments may optionally undergo a further tuning cycle at any point after completion of the initial tuning. Such a further tuning cycle may compensate for changes in the environment such as metal or other tags close to the resonator, or may be in response to changes in the amplitude of the energising field. Alternatively said further tuning cycle may be carried out after the initial tuning cycle to bring the resonance frequency closer to the frequency of the energising field. This may increase the amplitude of the resonator which may be beneficial in generating a larger or better quality backscatter signal from an RFID tag to an RFID interrogator. The further tuning cycle may switch discrete tuning elements into or out of the resonator.

In the above embodiments a charge current is applied to one or more MOSFET gates of a self-adaptive resonator to cause the resonance amplitude to increase to a threshold level. In these embodiments the charge current is inhibited when the resonator reaches a threshold level and the discrete tuning events are initiated at the same or a lower level. However in an alternative embodiment the discrete tuning events are initiated without the charge current being limited in response to the amplitude. The discrete tuning events may control the amplitude to a target level without this separate limit on the amplitude.

Embodiments described include a low frequency tag operating in the region of 125 kHz, although this frequency band chosen is purely by way of example. There is no implied limitation to frequencies around this band, rather all frequencies ranging from sub-sonic to microwave frequencies and beyond should be included. More specifically to RFID, all common RFID frequency bands are included, such as 125 kHz, 134 kHz, 13.56 MHz, 869 MHz, 915 MHz, etc.

The embodiments described focus on RFID tags as the main application, and may be full-duplex or half-duplex RFID tags. However, there is no implied limitation to this and the methods described are equally applicable to any application where the final tuned state may beneficially be a linear resonator. These methods allow initial ramp up of the resonator to a set level and subsequent transition to a linear resonator with an equivalent tuning. Other example applications include:

1) RFID readers or interrogators.
2) Active RFID tags
3) Wireless power
4) Power supplies
5) Communication systems, including radio, audio, and sonar communication systems.
6) Transmitters
7) Any resonant system requiring tuning.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A circuit block for a resonant circuit, the circuit block having a pair of connections for connection of the circuit block into the resonant circuit as a capacitor, the circuit block comprising:
   a first, non-linear capacitor, wherein capacitance of the said first, non-linear capacitor has two different values dependent on a value of a voltage of a resonant signal on the nonlinear capacitor;
   a power supply circuit coupled to said non-linear capacitor to provide a power supply for the circuit block;
   a plurality of second capacitors each coupled to a respective second capacitor switch to enable a said second capacitor to be switched in or out of parallel connection with said first, non-linear capacitor; and
   a tuning control circuit powered by said power supply, coupled to said second capacitor switches, and having an input to sense an amplitude of said resonant signal; and
   wherein said tuning control circuit is configured to control said second capacitor switches to successively switch said second capacitors in or out of said parallel connection with said first, non-linear capacitor dependent on said amplitude of said resonant signal until said first, non-linear capacitor has substantially a single one of said two different values such that in said resonant circuit said circuit block then appears to behave substantially as a fixed value capacitor,
   wherein the circuit block is configured to switch the capacitance of said first, non-linear capacitor to one said different value and to the other said different value according to an instantaneous value of the resonant signal and during a cycle of the resonant signal, to thereby determine a duty cycle of said capacitance switching.

2. A circuit block as claimed in claim 1 wherein said first, non-linear capacitor comprises a pair of series coupled capacitors with a transistor coupled across one of the pair.

3. A circuit block as claimed in claim 2 wherein said transistor is a field effect transistor, and further comprising a gate capacitor coupled to a gate of said field effect transistor, and a circuit to charge said gate capacitor to change an effective average capacitance value of said first, non-linear capacitor to increase an amplitude of said resonant signal towards a target amplitude, and wherein said tuning control circuit is configured successively to add or remove a said second capacitor from said parallel connection with said first, non-linear capacitor when a threshold amplitude is reached.

4. A circuit block as claimed in claim 3 wherein said tuning control circuit is configured to switch said second capacitor in or out of said parallel connection with said first, non-linear capacitor until said field effect transistor is substantially either fully on or fully off.

5. A circuit block as claimed in claim 1 wherein a said second capacitor switch is coupled in series with a said second capacitor, wherein a said second capacitor switch comprises a field effect transistor, and wherein each said series connected said second capacitor and second capacitor switch is coupled across said first, non-linear capacitor.

6. A circuit block as claimed in claim 1 wherein at least one coupled said second capacitor and said respective second capacitor switch comprises a non-linear capacitor.

7. A circuit block as claimed in claim 6 wherein a said second capacitor comprises a pair of series coupled capacitors with a transistor coupled across one of the pair, and wherein a said second capacitor switch is configured to control a gate voltage of the transistor coupled across one of the pair of series coupled capacitors.

8. A circuit block as claimed in claim 7 wherein said first, non-linear capacitor and said second, non-linear capacitors each comprise a respective field effect transistor with an associated gate capacitor, the circuit comprising a plurality of current mirrors to mirror a charge current of said gate capacitor of said first, non-linear capacitor to charge said gate capacitors of said second, non-linear capacitors.

9. A circuit block as claimed in claim 1 wherein said tuning control circuit is configured to force said first, non-linear capacitor to have substantially a single said value when all of said second capacitors have been switched in or out of said parallel connection with said first, non-linear capacitor.

10. A circuit block as claimed in claim 1 wherein said single one of said two different values is a maximum one of said two different values.

11. A resonant circuit comprising the circuit block of claim 1.

12. An RFID tag including the resonant circuit of claim 11.

13. A method of using a self-adaptive reactive element in a resonant circuit, said self-adaptive reactive element comprising a non-linear capacitor and having a reactive impedance which automatically adjusts to a frequency of a signal applied to said resonant circuit to bring a resonant frequency of said resonant circuit into alignment with said frequency of said applied signal, said reactive impedance of said self-adaptive reactive element varying between a maximum and a minimum value, the method comprising:
   deriving a power supply from said resonant circuit;
   using said power supply to switch additional reactive impedance in or out of said resonant circuit until said maximum or minimum value of said reactive impedance of said self-adaptive reactive element is reached, such that said self-adaptive element behaves substantially as a non-adaptive reactive element; and
   switching a capacitance of the non-linear capacitor to one value and to another, different value according to an instantaneous value of a resonant signal of the resonant circuit and during a cycle of the resonant signal, to thereby determine a duty cycle of said capacitance switching.

14. A controller for a self-adaptive reactive element of a resonant circuit, said self-adaptive reactive element comprising a non-linear capacitor and having a reactive impedance which automatically adjusts to a frequency of a signal applied to said resonant circuit to bring a resonant frequency of said resonant circuit into alignment with said frequency of said applied signal, said reactive impedance of said self-adaptive reactive element varying between a maximum and a minimum value, the controller comprising:
 a circuit to derive a power supply from said resonant circuit;
 a circuit to use said power supply to switch additional reactive impedance in or out of said resonant circuit until said maximum or minimum value of said reactive impedance of said self-adaptive reactive element is reached, such that said self-adaptive element behaves substantially as a non-adaptive reactive element,
 wherein the controller is configured to switch said additional reactive impedance in or out of said resonant circuit to thereby determine a duty cycle of capacitance switching, wherein said capacitance switching switches a capacitance of the non-linear capacitor to one value and to another, different value according to an instantaneous value of a resonant signal of the resonant circuit and during a cycle of the resonant signal.

15. A tuned circuit component comprising:
 a first capacitor;
 a first MOSFET;
 at least one second MOSFET;
 a second capacitor (C3) coupled in series with said first MOSFET, said series coupled second capacitor and first MOSFET being coupled in parallel with said first capacitor;
 at least one third capacitor coupled in series with said at least one second MOSFET, said series combination of said third capacitor and said second MOSFET being coupled in parallel with said first capacitor; and
 a plurality of said third capacitors each coupled in series with a respective said second MOSFET, each said series combination of said third capacitor and said second MOSFET being coupled in parallel with said first capacitor.

16. A tuned circuit component as claimed in claim 15 further comprising a fourth capacitor (C2), said fourth capacitor being coupled in parallel with said first MOSFET.

17. A tuned circuit component as claimed in claim 15, further comprising at least one fifth capacitor coupled across the or each said second MOSFET.

18. A tuned circuit component as claimed in claim 17 further comprising a gate capacitor coupled to a gate of the or each said second MOSFET.

19. A tuned circuit component as claimed in claim 15 further comprising a gate capacitor coupled to a gate of said first MOSFET to store a gate voltage for said first MOSFET.

20. A tuned circuit component as claimed in claim 19 further comprising a charge circuit coupled to said first capacitor to charge said first MOSFET gate capacitor.

21. A tuned circuit component as claimed in claim 20 further comprising an amplitude detect circuit coupled to detect an amplitude of a signal on said first capacitor, and a charge inhibit circuit coupled to said amplitude detect circuit to inhibit said charging when said amplitude exceeds a first threshold amplitude.

22. A tuned circuit component as claimed in claim 21 further comprising a capacitor select circuit coupled to said amplitude detect circuit to control a said second MOSFET to switch a said third capacitor in or out of said parallel coupling with said first capacitor when said amplitude exceeds a second said threshold amplitude.

23. A tuned circuit component as claimed in claim 22 wherein said capacitor select circuit includes a delay circuit to inhibit said switching of one said third capacitor in or out of said parallel coupling until a delay interval after switching a previous said third capacitor in or out of said parallel coupling.

24. A self-powered resonant circuit, the circuit comprising:
 at least one self-adaptive resonant circuit comprising a non-linear capacitor, said self-adaptive resonant circuit having a resonant frequency which automatically tunes to a frequency of a signal applied to said self-adaptive resonant circuit;
 a power supply circuit to coupled to said self-adaptive resonant circuit to derive a power supply from a resonant signal in said self-adaptive resonant circuit;
 a plurality of switched reactive elements each coupled to said self-adaptive resonant circuit; and
 a controller to selectively switch said switched reactive elements into said selfadaptive resonant circuit until said self-adaptive resonant circuit has reached substantially a limit of a range of said automatic tuning,
 wherein the self-powered resonant circuit is configured to switch a capacitance of the non-linear capacitor to one value and to another, different value according to an instantaneous value of a resonant signal of the resonant circuit and during a cycle of the resonant signal, to thereby determine a duty cycle of said capacitance switching.

25. A tuned circuit having a non-linear capacitor, the non-linear capacitor comprising a series coupled pair of capacitors and a first MOSFET coupled across one of said pair of capacitors, the tuned circuit having a system to change a gate voltage of said first MOSFET dependent on an amplitude of a resonant signal in said tuned circuit, a system to inhibit said changing when a threshold said amplitude is reached, and a system to switch in or out reactive impedance of said tuned circuit when said threshold is reached until said first MOSFET is either substantially fully on or substantially fully off, wherein the tuned circuit is configured to switch a capacitance of the non-linear capacitor to one value and to another, different value according to an instantaneous value of a resonant signal of the resonant circuit and during a cycle of the resonant signal, to thereby determine a duty cycle of said capacitance switching.

26. A tuned circuit as claimed in claim 25 wherein said system to switch in or out reactive impedance of said tuned circuit is configured to switch said reactive impedance in or out stepwise with a delay between successive steps.

27. A tuned circuit as claimed in claim 25 wherein said system to switch in or out reactive impedance of said tuned circuit is configured to switch in said reactive impedance until said first MOSFET is substantially fully on.

28. A tuned circuit as claimed in claim 25, wherein said reactive impedance comprises series coupled pairs of capacitors across each capacitor of a said pair of which is connected a MOSFET.

29. A tuned circuit as claimed in claim 25, wherein said reactive impedance comprises pairs of series coupled capacitors and MOSFETs.

30. An RFID tag including a tuned circuit as claimed in claim 25.

* * * * *